United States Patent
Bowles et al.

(10) Patent No.: US 9,499,397 B2
(45) Date of Patent: Nov. 22, 2016

(54) MICROELECTRONIC PACKAGES HAVING AXIALLY-PARTITIONED HERMETIC CAVITIES AND METHODS FOR THE FABRICATION THEREOF

(71) Applicants: Philip H. Bowles, Gilbert, AZ (US); Stephen R. Hooper, Mesa, AZ (US)

(72) Inventors: Philip H. Bowles, Gilbert, AZ (US); Stephen R. Hooper, Mesa, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 247 days.

(21) Appl. No.: 14/230,273

(22) Filed: Mar. 31, 2014

(65) Prior Publication Data
US 2015/0274515 A1    Oct. 1, 2015

(51) Int. Cl.
*B81B 7/02* (2006.01)

(52) U.S. Cl.
CPC .......... *B81B 7/02* (2013.01); *B81B 2201/0235* (2013.01); *B81B 2201/0242* (2013.01)

(58) Field of Classification Search
CPC ................................................ B81C 1/00539
See application file for complete search history.

(56) References Cited

U.S. PATENT DOCUMENTS

| | | | |
|---|---|---|---|
| 8,250,921 B2 | 8/2012 | Nasiri et al. | |
| 2008/0248613 A1* | 10/2008 | Chen | B81B 3/0005 438/115 |
| 2012/0212925 A1 | 8/2012 | Zoellin et al. | |
| 2013/0270660 A1* | 10/2013 | Bryzek | H01L 29/84 257/418 |
| 2014/0130595 A1* | 5/2014 | Zhao | B81B 7/02 73/495 |
| 2015/0091153 A1* | 4/2015 | Liu | B81C 1/00293 257/704 |

FOREIGN PATENT DOCUMENTS

CN        101643193 A        2/2010

* cited by examiner

*Primary Examiner* — Mohammad Choudhry

(57) ABSTRACT

Microelectronic packages and methods for producing microelectronic packages are provided. In one embodiment, the method includes bonding a first Microelectromechanical Systems (MEMS) die having a first MEMS transducer structure thereon to a cap piece. The first MEMS die and cap piece are bonded such that a first hermetically-sealed cavity is formed enclosing the first MEMS transducer. A second MEMS die having a second MEMS transducer structure thereon is further bonded to one of the cap piece and the second MEMS die. The second MEMS die and the cap piece are bonded such that a second hermetically-sealed cavity is formed enclosing the second MEMS transducer. The second hermetically-sealed cavity contains a different internal pressure than does the first hermetically-sealed cavity.

20 Claims, 8 Drawing Sheets

MICROELECTRONIC PACKAGES HAVING AXIALLY-PARTITIONED HERMETIC CAVITIES AND METHODS FOR THE FABRICATION THEREOF

TECHNICAL FIELD

Embodiments of the present invention relate generally to microelectronic packaging and, more particularly, to microelectronic packages having axially-partitioned hermetic cavities, as well as to methods for the fabrication thereof.

BACKGROUND

Microelectronic packages are commonly produced to contain two or more multi-axis sensors, such as a three axis Microelectromechanical Systems (MEMS) accelerometer and a three axis MEMS gyroscope. The transducer structures for the MEMS accelerometer and the MEMS gyroscope may be formed on a single die in a side-by-side relationship. A cap piece lacking active circuitry (commonly referred to as a "dummy cap") may be bonded to the frontside of the die to form a hermetically-sealed cavity enclosing the accelerometer and gyroscope transducer structures. A known pressure is sealed within the hermetic cavity to improve the performance of the MEMS transducer structures. However, such a single cavity design generally requires that the accelerometer and gyroscope transducer structures are exposed to a common pressure. This can be disadvantageous as the optimal pressure at which the accelerometer structure operates may differ as compared to the optimal pressure at which the gyroscope transducer structure operates. Thus, exposing these disparate MEMS transducer structures to a single pressure may require a trade-off or compromise in the performance of at least one of the MEMS devices. As a further drawback, the formation of the accelerometer and gyroscope transducer structures in a side-by-side relationship on a single die may enlarge the overall planform dimensions of the microelectronic package.

It is thus desirable to provide embodiments of a microelectronic package including at least two MEMS transducer structures, such as accelerometer and gyroscope transducer structures, which are enclosed in fluidly-isolated hermetic cavities. In this manner, a different pressure may be sealed within each hermetic cavity to optimize the performance of the particular MEMS transducer structure enclosed thereby. Ideally, embodiments of such a microelectronic package would also be structurally robust and have relatively compact planform dimensions. It would also be desirable to provide embodiments of a method for fabricating microelectronic packages having one or more of the foregoing characteristics. Other desirable features and characteristics of embodiments of the present invention will become apparent from the subsequent Detailed Description and the appended Claims, taken in conjunction with the accompanying drawings and the foregoing Background.

BRIEF DESCRIPTION OF THE DRAWINGS

At least one example of the present invention will hereinafter be described in conjunction with the following figures, wherein like numerals denote like elements, and.

Figure 1:
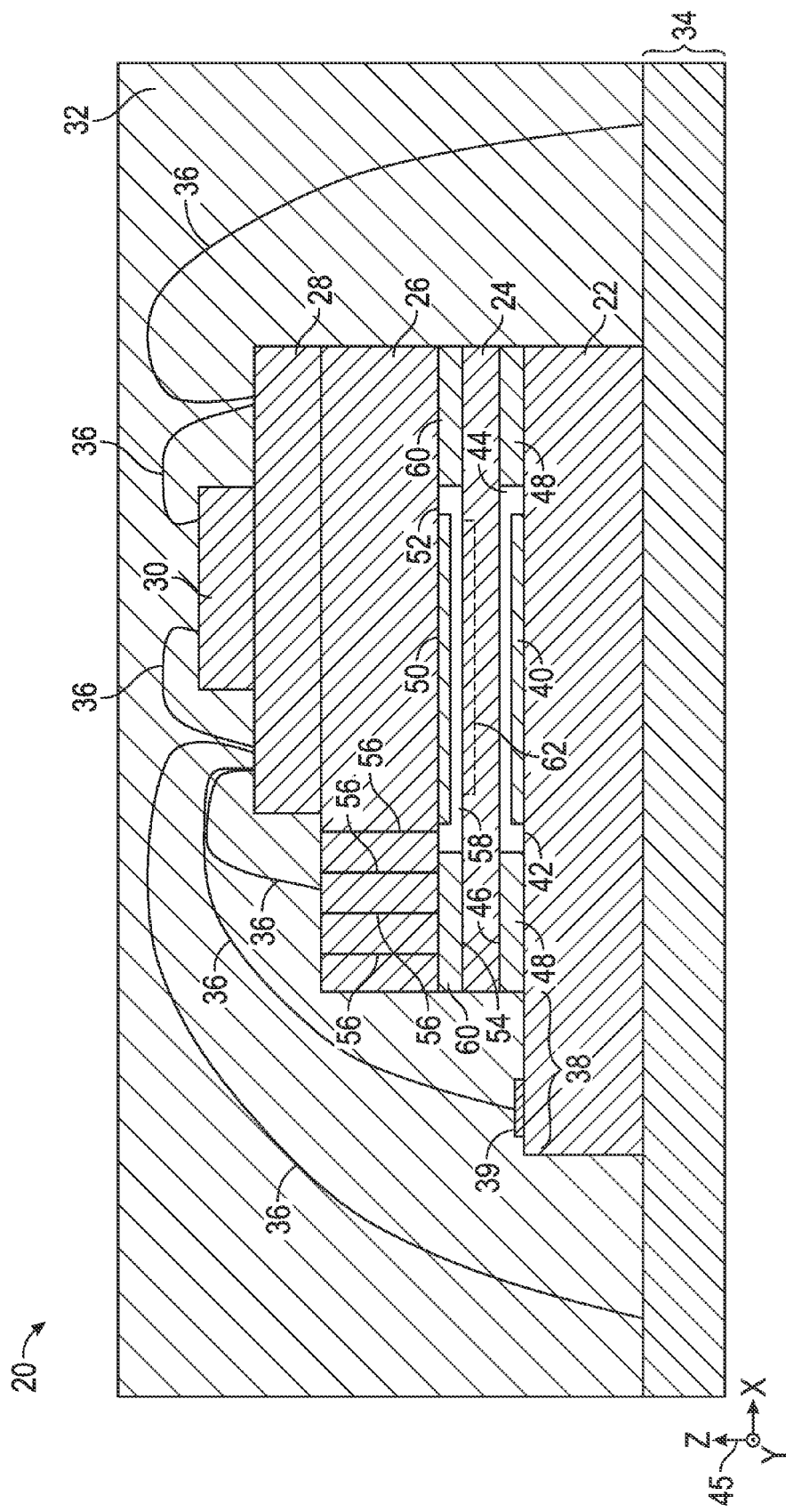
FIG. 1 is a cross-sectional view of a microelectronic package having axially-partitioned hermetic cavities, which enclose different MEMS transducer structures and which contain disparate internal pressures, as illustrated in accordance with an exemplary embodiment of the present invention.

For simplicity and clarity of illustration, the drawing figures illustrate the general manner of construction, and descriptions and details of well-known features and techniques may be omitted to avoid unnecessarily obscuring the exemplary and non-limiting embodiments of the invention described in the subsequent Detailed Description. It should further be understood that features or elements appearing in the accompanying figures are not necessarily drawn to scale unless otherwise stated. For example, the dimensions of certain elements or regions in the figures may be exaggerated relative to other elements or regions to improve understanding of embodiments of the invention.

DETAILED DESCRIPTION

The following Detailed Description is merely exemplary in nature and is not intended to limit the invention or the application and uses of the invention. Any implementation described herein as exemplary is not necessarily to be construed as preferred or advantageous over other implementations. Furthermore, there is no intention to be bound by any theory presented in the preceding Background or the following Detailed Description.

As appearing herein, the term "microelectronic component" is utilized in a broad sense to refer to an electronic device, element, or structure produced on a relatively small scale and amenable to packaging in the below-described manner. Microelectronic components include, but are not limited to, integrated circuits formed on semiconductor die, MEMS devices, passive electronic components (e.g., a discrete resistor, capacitor, inductor, or diode), optical devices, and other small scale electronic devices capable of providing processing, memory, sensing, radiofrequency, optical, and actuator functionalities, to list but a few examples. The term "wafer" is utilized to encompass bulk semiconductor (e.g., silicon) wafers, layered structures (e.g., silicon-on-insulator substrates), and other structures over which number of semiconductor devices, MEMS devices, or the like can be produced utilizing global or wafer-level processing techniques. The term "die" is utilized in reference to a singulated piece of a wafer on which one or more integrated circuits, MEMS devices, and/or another microelectronic component has fabricated via wafer-level processing of the wafer. Finally, as still further appearing herein, the phrase "produced on," the phrase "fabrication on," and the like encompass the terms "over" and "in" such that a device "fabricated on" a semiconductor wafer may be produced over a principal surface thereof, in the body of the wafer, or a combination thereof.

The following describes microelectronic packages and methods for fabricating microelectronic packages containing at least two axially-partitioned hermetic cavities. As appearing herein, the term "axially-partitioned" indicates that the hermetic cavities are formed at different levels within the microelectronic package and on opposing sides of an intervening structure, such as a sensor die or cap piece. In many cases, the microelectronic package is fabricated to include a first or upper hermetic cavity and a second or lower hermetic cavity, which underlies or vertically overlaps with at least a portion of the upper hermetic cavity as taken along the package centerline; however, the hermetic cavities are not required to vertically overlap in all embodiments of the microelectronic packages. Regardless of whether the cavities are vertically overlapping, the hermetic cavities are fluidly isolated and contain different pressures selected to optimize the performance of the particular MEMS transducer structure enclosed within the cavity. The hermetic cavities may enclose various different types of MEMS transducer structures including, but not limited to, MEMS accelerometer structures, MEMS gyroscope structures, and MEMS pressure sensor structures.

The MEMS transducer structures enclosed by the axially-partitioned hermetic cavities are advantageously formed on separate MEMS die. During fabrication of the microelectronic package, the separate MEMS die may be bonded in a stacked configuration along with a cap piece. If desired, additional microelectronic components, such as a discrete Application Specific Integrated Circuit (ASIC) die and/or a magnetometer die, can also be stacked or otherwise combined with the two MEMS sensor die and the cap piece in the microelectronic package; however, this is by no means necessary. By virtue of such a stacked or three dimensional package architecture, embodiments of the microelectronic packages may be produced to have reduced planform dimensions as compared to other known microelectronic packages, such as packages containing MEMS transducer structures disposed in a side-by-side relationship. Furthermore, in certain embodiments, an ASIC or other circuitry may be produced on the cap piece to eliminate the need for a discrete ASIC die thereby reducing package height or thickness. As a still further advantage, the below-described package fabrication method can be performed, in whole or at least in substantial part, on a wafer level to allow the simultaneous production of a large number of microelectronic packages. In this manner, manufacturing efficiency can be improved, throughput may be maximized, and highly precise alignment between those components bonded in wafer form (e.g., the MEMS die and cap pieces) can be achieved.

FIG. 1 is a simplified cross-sectional view of a microelectronic package 20, as illustrated in accordance with an exemplary embodiment of the present invention. Moving from bottom to top in FIG. 1, microelectronic package 20 includes a first MEMS die 22, a cap piece 24, a second MEMS die 26, an ASIC die 28, and a third MEMS die 30. The foregoing microelectronic components are packaged in a stack configuration and contained within a molded package body 32. An Input/Output (I/O) structure 34 is formed over the frontside of package body 32 (the lower surface of body 32 in the illustrated orientation). I/O interface 34 is generically illustrated as Land Grid Array (LGA) in the embodiment shown in FIG. 1; however, I/O interface 34 can assume any form providing points-of-contact accessible from the exterior of package 20, which enable electrical communication with packaged die 22, 26, 28, and 30 and, specifically, with the circuitry formed thereon. In further embodiments, I/O interface 34 may include or assume the form of one or more redistribution or build-up layers, a leadframe, an interposer, or the like. Similarly, various different types of electrically-conductive interconnection features may be utilized to electrically interconnect die 22, 26, 28, and 30 and I/O interface 34. In the illustrated example, a number of wire bonds 36 provide the desired interconnections. To permit wirebonding to the circuitry located on the active or frontside of die 22, MEMS die 22 is fabricated to include a bond pad shelf 38, which extends laterally beyond cap piece 24 and MEMS die 26 in at least one direction and on which a number of bond pads 39 are disposed (one of which can be seen in FIG. 1). Additional bond pads may likewise be provided in appropriate locations on the other packaged devices, but are not shown in FIG. 1 for clarity.

A first MEMS transducer structure 40 is formed on the active surface or frontside 42 of MEMS die 22. MEMS transducer structure 40 is enclosed within a hermetic cavity 44, which contains a known pressure selected to optimize the performance of structure 40. Hermetic cavity 44 is axially bound (that is, bound as taken along the package centerline or the Z-axis identified in FIG. 1 by coordinate legend 45) by MEMS die 22 and a lower surface 46 of cap piece 24. Hermetic cavity 44 is further bound about its perimeter by a seal ring 48, which is disposed between cap piece 24 and MEMS die 22. While shown in cross-section in FIG. 1, seal ring 48 forms a continuous 360° seal around cavity 44 and may have a generally rectangular, square, circular, or other geometry when viewed from a top-down or planform perspective. Seal ring 48 may also help bond MEMS die 22 to cap piece 24. Seal ring 48 can be formed from any material that can be deposited in a desired shape between MEMS die 22 and cap piece 24 to form an airtight or hermetic seal. A non-exhaustive list of suitable bonding materials includes aluminum-germanium alloy, copper, copper alloys, and gold-tin alloys. The manner in which seal ring 48 may be formed between MEMS die 22 and cap piece 24 during fabrication of microelectronic package 20 is discussed more fully below in conjunction with FIGS. 2-4.

A second MEMS transducer structure 50 is formed on the active surface or frontside 52 of MEMS die 26. In contrast to MEMS die 22, MEMS die 26 is packaged in an inverted orientation such that frontside 52 of MEMS die 26 and, therefore, MEMS transducer structure 50 faces the frontside 42 of MEMS die 22, MEMS transducer structure 40, and upper surface 54 of cap piece 24. MEMS die 22 and 26 are thus stacked in a face-to-face relationship with cap piece 24 intervening therebetween. As indicated in FIG. 1, a number of Through Silicon Vias (TSVs) 56 may be formed through the body of MEMS die 26 to provide electrical interconnection between the circuitry formed on the frontside of die 26 and wire bonds 36 contacting the backside of die 26. MEMS transducer structures 40 and 50 will typically vary in type. In one embodiment, one of MEMS transducer structure 40 and MEMS transducer structure 50 assumes the form of a three axis gyroscope transducer structure, while the other of structures 40 or 50 assumes the form of a three axis accelerometer transducer structure. While illustrated as having approximately the same width in FIG. 1, the relative dimensions of MEMS transducer structures 40 and 50 can and typically will vary among embodiments. For example, in an embodiment wherein structures 40 and 50 are gyroscope and accelerometer transducer structures, respectively, MEMS transducer structure 40 will typically have larger planform dimensions than does MEMS transducer structure 50.

A second hermetic cavity 58 is formed enclosing MEMS transducer structure 50. Hermetic cavity 58 is defined by frontside 52 of MEMS die 26, upper surface 54 of cap piece 24, and a second seal ring 60. Hermetic cavity 58 is thus bound along its perimeter by seal ring 60 and axially bound by die 26 and cap piece 24, as taken along the package centerline or along the Z-axis in FIG. 1. Once again, seal ring 60 may be formed from any material amenable to controlled wafer-level deposition and capable of forming a gas-tight or hermetic seal. Such materials include, but are not limited to, those listed above as candidate materials for the formation of seal ring 48; although it may be preferred that seal rings 48 and 60 are formed from different materials for reasons discussed more fully below. Although by no means essential, seal ring 60 can formed to have a shape and planform dimensions similar to those of seal ring 48; e.g., both seal ring 48 and seal ring 60 may be produced as square or rectangular-shaped structures, which extend around an outer peripheral portion of intervening cap piece 24. Furthermore, in the illustrated embodiment, seal rings 48 and 60 overlap vertically, as taken along the package centerline or along the Z-axis. Collectively, MEMS die 22, cap piece 24, and MEMS die 26 and the structures disposed therebetween (e.g., seal rings 48 and 60) may be referred to herein as a "die-cap stack 22, 24, 26."

Hermetic cavities 44 and 58 are fluidly isolated from each other and from the surrounding environment. Different pressures may thus be sealed within cavities 44 and 58 during fabrication of package 20 to optimize the performance of the particular MEMS transducer structures enclosed thereby. As a non-limiting example, in an embodiment wherein MEMS transducer structure 40 is a gyroscope transducer structure, while MEMS transducer structure 50 is an accelerometer transducer structure, cavities 44 and 58 may be sealed at first and second predetermined pressures, respectively, with the first predetermined pressure being less than the second predetermined pressure. More specifically, hermetic cavity 44 (the cavity enclosing a gyroscope transducer structure in this example) may be sealed at a pressure near vacuum (e.g., a pressure of about 1 torr), while hermetic cavity 58 (the cavity enclosing an accelerometer transducer structure in this example) may be sealed at a pressure of approximately 1 atmosphere (atm). In other embodiments, the pressures within cavities 44 and 58 may be greater than or less than the aforementioned examples. Air, nitrogen, or another inert gas may be sealed within hermetic cavities 44 and 58 at the desired pressures.

In certain implementations, the Degrees Of Freedom (DOFs) attributed to microelectronic package 20 may be provided exclusively by die-cap stack 22, 24, 26 and, specifically, by the MEMS sensors formed on die 22 and 26. Thus, in embodiments wherein die 22 and 26 carrying a three axis gyroscope and a three axis accelerometer, microelectronic package 20 may have a total of six DOFs. Alternatively, one or more additional sensors may be packaged with die-cap stack 22, 24, 26 to impart package 20 with additional DOFs. Thus, as indicated in FIG. 1, die stack 22, 24, 26 may be further combined with a solid state three axis magnetometer carried by die 30 to yield a 9-DOF microelectronic package. If desired, a discrete ASIC die 28 can also be disposed within package 20 to control the functionality of the MEMS devices contained therein. As ASIC die 28 will typically have larger planform dimensions than does MEMS die 30, MEMS die 30 may be stacked onto ASIC die 28, which is, in turn, stacked onto MEMS die 26, as shown in FIG. 1. However, in further embodiments, the microelectronic components included within package 20 and the spatial disposition of the components may vary. In certain embodiments, an ASIC may be formed on cap piece 24 (indicated in FIG. 1 by dashed box 62), which may eliminate the need to provide a discrete ASIC die within package 20. In this case, ASIC die 28 may be omitted from microelectronic package 20 to reduce package height and fabrication costs.

It should thus be appreciated that microelectronic package 20 includes two fluidly-isolated hermetic cavities (i.e., cavities 44 and 58), which are axially partitioned by an intervening structure (i.e., cap piece 24) and which contain disparate internal pressures. By allowing different pressures to be sealed within the fluidly-isolated cavities, the pressure within each cavity can be tailored to optimize the performance of the MEMS transducer structures enclosed thereby to enhance the overall performance of package 20. Additionally, the above-described MEMS transducer structures are formed on separate die stacked in a face-to-face or active surface-to-active surface relationship thereby reducing the overall planform dimensions of microelectronic package 20. As a still further benefit, fabrication of microelectronic package 20 can be carried-out, in whole or at least in substantial part, on a wafer level to allow a number of other microelectronic packages to be produced in parallel with package 20. This favorably increases manufacturing efficiency, maximizes throughput, and allows highly precise alignment to be achieved between at least the sealed MEMS die and the cap piece when bonded in wafer form. An exemplary embodiment of a manufacturing method suitable for producing microelectronic package 20 along with a number of other microelectronic packages will now be described in conjunction with FIGS. 2-8.

Figure 2:
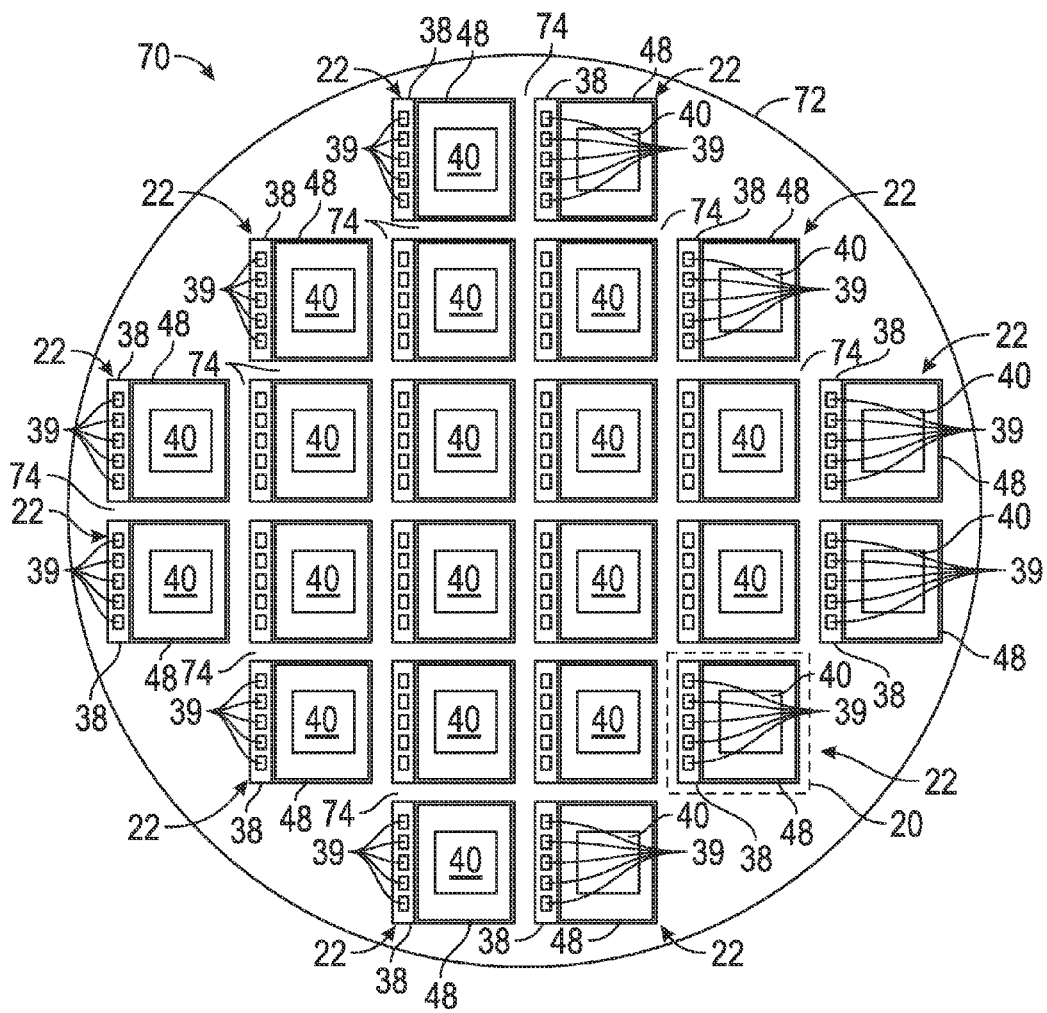
FIG. 2 is a planform or top-down view of a first exemplary MEMS wafer, which includes an array of non-singulated MEMS die and which may be processed to produce the microelectronic package shown in FIG. 1 along with a number of other microelectronic packages.
Figure 3:
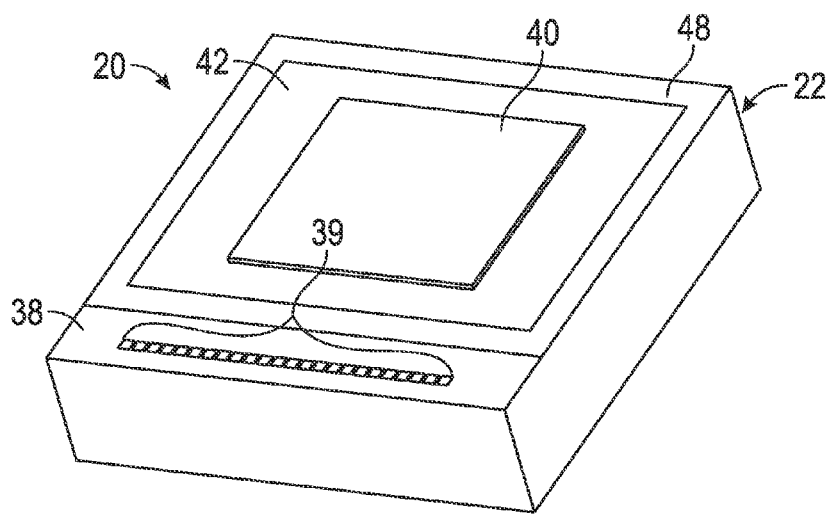
FIG. 3 is an isometric view of a first MEMS die contained within the MEMS wafer shown in FIG. 2 (the surrounding portions of the wafer not shown) and processed during fabrication of the microelectronic package shown in FIG. 1.
Figure 4:
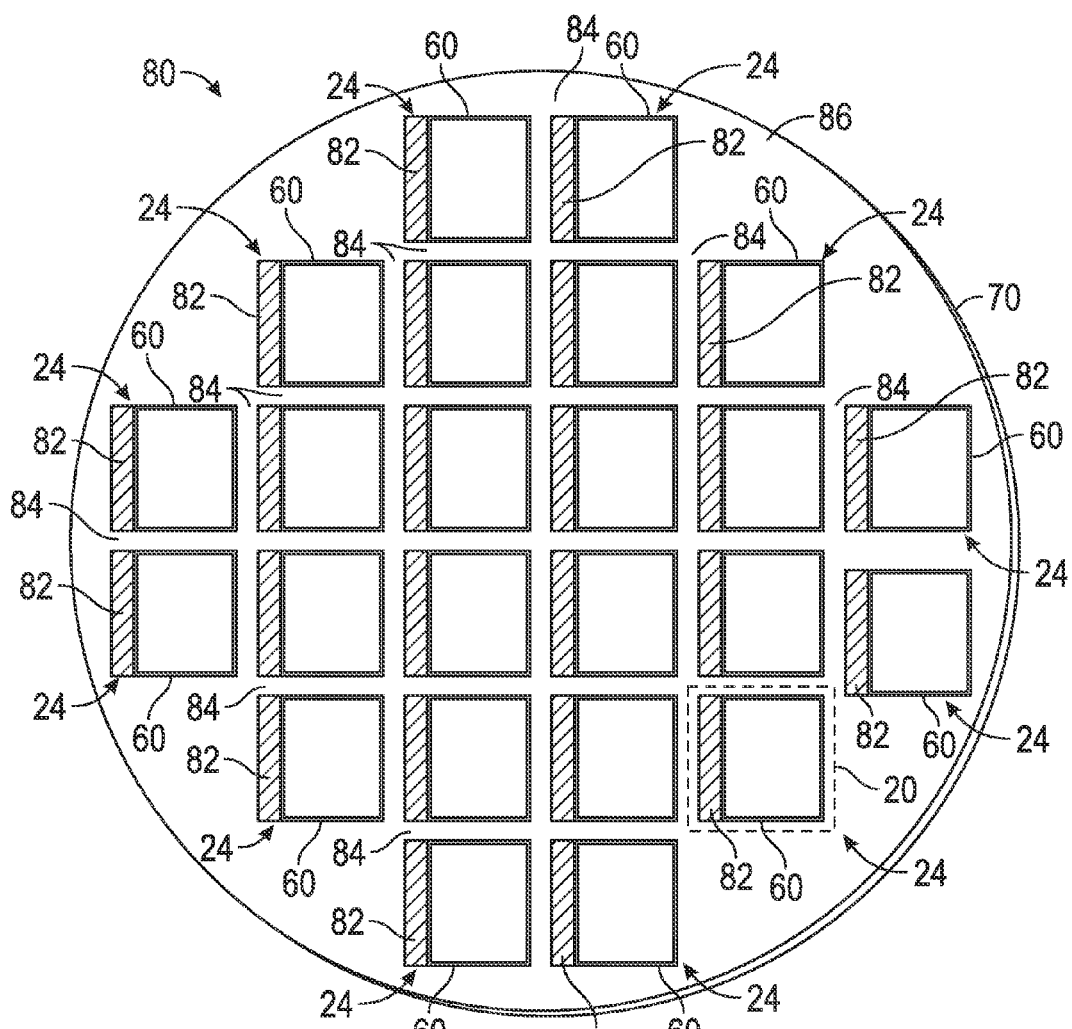
FIG. 4 is a planform or top-down view of an exemplary cap piece wafer, which includes an array of non-singulated cap pieces, which is stacked onto the MEMS wafer shown in FIG. 2, and which may be processed therewith to produce the microelectronic package shown in FIG. 1 along with a number of other microelectronic packages.
Figure 5:
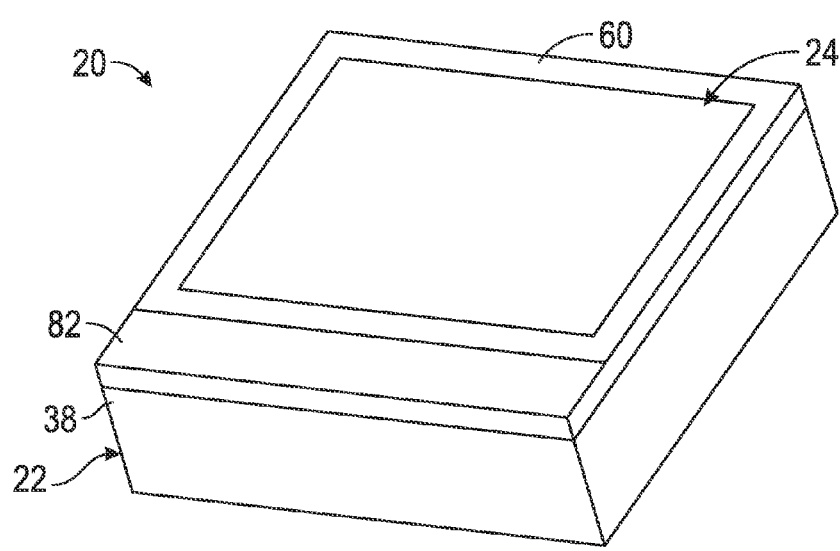
FIG. 5 is an isometric view of a cap piece contained within the cap piece wafer shown in FIG. 4 (the surrounding portions of the wafer not shown) and bonded over the first MEMS die (FIG. 3) during fabrication of the microelectronic package shown in FIG. 1.
Figure 6:
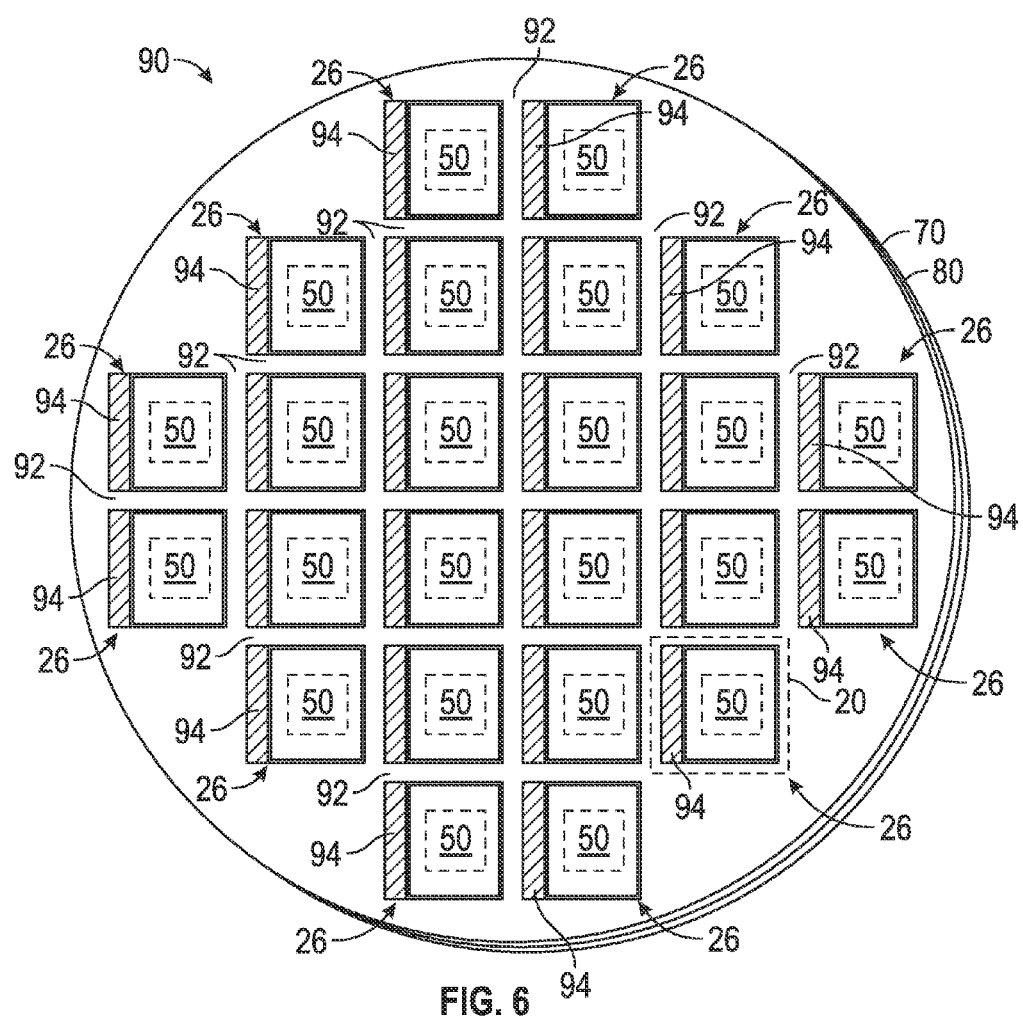
FIG. 6 is a planform or top-down view of a second exemplary MEMS wafer, which includes an array of non-singulated MEMS die, which is stacked onto the cap piece wafer shown in FIG. 4, and which may be processed therewith to produce the microelectronic package shown in FIG. 1 along with a number of other microelectronic packages.
Figure 7:
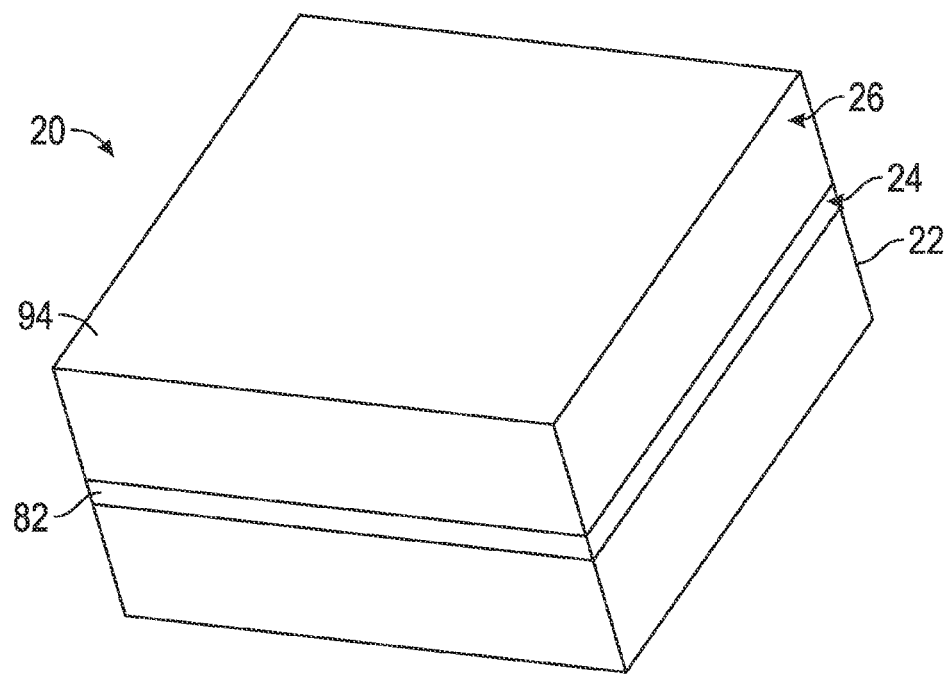
FIGS. 7 and 8 are isometric view of a second MEMS die contained within the MEMS wafer shown in FIG. 6 (the surrounding portions of the wafer not shown) and bonded over the cap piece (FIG. 5) and the first MEMS die (FIG. 3) processed during fabrication of the microelectronic package shown in FIG. 1.
Figure 8:
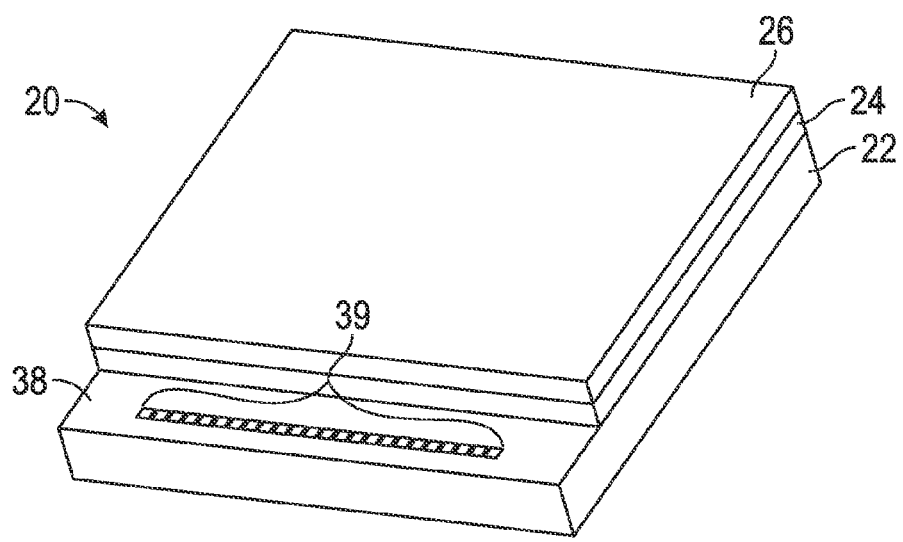

FIGS. 2-8 illustrate microelectronic package 20 at various stages of completion, as produced in accordance with an exemplary embodiment of the present invention. In FIGS. 2, 4, and 6, specifically, entire wafers or wafer stacks are shown of which package 20 only constitutes a relatively small portion; thus, in these figures, a dashed box identified by reference numeral "20" has been utilized to identify the area of the wafer or wafer stack corresponding to partially-completed package 20. As shown in FIGS. 2-8 and described further below, the fabrication method is offered by way of non-limiting example only. It is emphasized that the fabrication steps shown in FIGS. 2-8 can be performed in alternative orders, that certain steps may be omitted in alternative embodiments, and that additional steps may be performed in alternative embodiments. Description of structure and processes known within the semiconductor industry may be limited or entirely omitted without providing the well-known process details. Furthermore, while described below in conjunction with the production of a particular type of microelectronic package (i.e., microelectronic package 20 shown in FIG. 1), it is emphasized that the below-described processing steps can be performed to produce microelectronic packages that vary in structure and function as compared to package 20.

With reference to FIG. 2, there is shown a MEMS wafer 70 having a frontside 72 over which a number of MEMS die 22 have been produced by wafer-level processing. At this juncture in the fabrication process, MEMS die 22 remain interconnected as a solid or unbroken wafer and may consequently be referred to as "non-singulated MEMS die 22." MEMS die 22 are spatially distributed across wafer 70 in, for example, a grid arrangement. While a relatively limited number of die 22 are shown in FIG. 2, any practical number of MEMS die 22 can be distributed across wafer 70 in various different spatial arrangements. MEMS die 22 are interspersed with a number of saw lanes 74, which are areas of wafer 70 lacking active circuitry and removed during singulation of wafer 70. In the illustrated example, each MEMS die 22 is produced to include at least one MEMS transducer structure 40 and a number of bond pads 39, which are disposed over the frontside of the die (in particular, on a bond pad shelf 38) to provide points-of-contact to the circuitry formed thereon (not shown). As shown in FIG. 2, MEMS transducer structure 40 may be located in a central region of each die 22, while bond pads 39 may be disposed in one or more rows bordering structure 40. However, the illustrated layout is offered by way of example only and will vary amongst different embodiments.

FIG. 3 is an isometric view one of MEMS die 22 included within MEMS wafer 70 and corresponding to partially-fabricated microelectronic package 20. To avoid unnecessary obscuring the drawing, only the portion of wafer 70 corresponding to a single MEMS die 22 is shown in FIG. 3 with the understanding that the illustrated die 22 still remains in wafer form at the present juncture of manufacture. Referring collectively to FIGS. 2 and 3, it can be seen that a seal ring 48 has been deposited around each MEMS transducer structure 40. As noted above, seal rings 48 may serve two purposes. First, seal rings 48 bond MEMS wafer 70 (and, therefore, MEMS die 22) to the below-described cap wafer 80 (and, therefore, to cap pieces 24 making-up cap wafer 80). Second, seal rings 48 form a continuous 360° hermetic seal around MEMS transducer structures 40 such that, when MEMS wafer 70 is bonded to the below-described cap wafer, a number of hermetic cavities are formed enclosing MEMS transducer structures 40. Each hermetic cavity encloses a MEMS transducer structure 40 and also contains a known internal pressure, which is selected to optimize the performance of the MEMS die 22 carrying the transducer structure 40. As discussed above, seal rings 48 can be produced from aluminum-germanium alloy, copper, copper alloys, gold-tin alloys, or another bonding material that may or may not be electrically conductive. Such materials may be plated or otherwise deposited onto frontside 72 of wafer 70 prior to bonding to the below-described cap piece wafer, as shown. Alternatively, seal rings 48 can be deposited onto the cap piece wafer prior to the below-described wafer-to-wafer bonding process.

FIG. 4 illustrates a two wafer stack 70, 80 produced pursuant to bonding a cap piece wafer 80 to frontside 22 of MEMS wafer 70. In FIG. 4, MEMS wafer 70 underlies cap piece wafer 80 and is thus largely hidden from view. Cap piece wafer 80 includes an array of non-singulated cap pieces 24, which do not include active circuitry (commonly referred to as "dummy caps"); however, in further embodiments, an ASIC or other circuitry may be formed on each cap piece 24. When cap piece wafer 80 is bonded over MEMS wafer 70, each cap piece 24 vertically overlaps with or aligns with an underlying MEMS die 22. During wafer-to-wafer bonding, seal rings 48 adhere to or otherwise sealingly contact the backside of wafer 80 (not shown) to form hermetic cavities distributed across wafer stack 70, 80 enclosing MEMS transducer structures 40 disposed on frontside 72 of MEMS wafer 70 (FIGS. 1-3). The hermetic cavities formed by bonding cap piece wafer 80 and MEMS wafer 70 cannot be seen in FIG. 4, but may each assume a form identical or similar to hermetic cavity 44 of package 20 shown in FIG. 1.

In embodiments wherein MEMS die 22 are fabricated to include bond pads shelves 38 (FIGS. 1-3), cap pieces 24 may include sacrificial areas 82 (represented by cross-hatching in FIG. 4), which overlie shelves 38 after bonding of MEMS wafer 70 and cap piece wafer 80. Prior to singulation of wafer stack 70, 80, sacrificial areas 82 are removed, utilizing the below-described saw-to-reveal process to permit wire-bonding to the bond pads located on bond pad shelves 38. Including sacrificial areas 82, cap pieces 24 may have planform shapes and dimensions similar to MEMS die 22 to facilitate singulation of wafer stack 70, 80. In particular, saw lanes 84 may be provided between non-singulated cap pieces 24, which overlap with saw lanes 74 of MEMS wafer 70 when wafers 70 and 80 are stacked in the manner shown in FIG. 4. This facilitates singulation of the wafer stack, as described below.

During bonding, MEMS wafer 70 and cap piece wafer 80 are brought into contact and subject to controlled conditions (e.g., elevated heat and pressures) sufficient to create the desired bond between MEMS wafer 70 and cap wafer 80 and, therefore, between corresponding pairs of MEMS die 22 and cap pieces 24. The bonding process is carried-out at a controlled pressure to impart the hermetically-sealed cavities formed between MEMS wafer 70 and cap piece wafer 80 with a desired internal pressure. The pressure at which the bonding process is carried-out may be greater than the desired pressure within the cavities if the bonding process is performed under elevated temperature conditions. For example, if it is desired for the pressure within the cavities to be approximately 0.1 torr (as may be case when MEMS transducer structures 40 are gyroscope transducer structures), the bonding process may be carried-out at a pressure of 0.3 torr and at an elevated temperature such that the desired pressure is achieved within the cavities upon cooling of wafer stack 70, 80.

After bonding cap piece wafer 80 to MEMS wafer 70, a second plurality of seal rings 60 may be plated or otherwise deposited over selected areas of principal surface 86 of cap piece wafer 80. FIG. 5 illustrates the region of wafer stack 70, 80 corresponding to partially-completed microelectronic package 20 after the deposition of one such seal ring 60 (again, the surrounding regions of wafer stack 70, 80 not shown). Seal rings 60 can be deposited to have the same general planform shape and dimensions as do seal rings 48 (FIGS. 1-3). In further embodiments, the shape and dimensions of seal rings 48 and 60 may vary. Seal rings 60 are deposited at selected locations such that, pursuant to bonding cap piece wafer 80 to a second MEMS wafer (e.g., MEMS wafer 90 described below), seal rings 60 each extend around or circumscribe a MEMS transducer structure provided on the second MEMS wafer. Seal rings 60 can be produced in essentially the same manner and from the same type of materials are as seal rings 48 (FIGS. 1 and 2). However, it is preferred that the material utilized to produce seal rings 60 has a lower bonding temperature than does the bonding material from which seal rings 48 are produced. In this way, processing conditions can be controlled to reduce the likelihood of undesirable reflow of seal rings 48 during bonding of cap piece wafer 80 to the second MEMS wafer, which may otherwise compromise the integrity of the hermetically-sealed cavities formed between MEMS wafer 70 and cap piece wafer 80.

FIG. 6 is a planform view of a three wafer stack 70, 80, 90 produced by bonding a second or upper MEMS wafer 90 to surface 86 of cap piece wafer 80 (FIG. 4). As is lower MEMS wafer 70, MEMS wafer 80 is comprised of an array of non-singulated MEMS die 26. Each die 26 includes at least one transducer structure 50 formed on the frontside of the die and, more generally, on the frontside of MEMS wafer 80. Transducer structures 50 are shown in phantom in FIG. 6 as the frontside of MEMS wafer 80 has been bonded to surface 86 of cap piece wafer 80 and is consequently hidden from view. MEMS wafer 90 further includes a number of saw lanes 92, which are interspersed with MEMS die 26 and which generally align with saw lanes 74 and 84 of underlying wafers 70 and 80, respectively. As was the case previously, wafer-to-wafer bonding is carried-out under processing conditions (pressures and temperatures) sufficient to create the desired bonds between seal rings 60 (FIGS. 4 and 5) and the frontside of wafer 90, while entrapping a desired internal pressure within the hermetic cavities formed between wafers 80 and 90. For example, if it is desired for the pressure within the cavities to be approximately 1 atm (as may be case when MEMS transducer structures 50 are accelerometer transducer structures), the bonding process may be carried-out at a pressure of 2-4 atm and at an elevated temperature such that the desired pressure is achieved within the cavities upon cooling of wafer stack 70, 80, 90. While the hermetic cavities formed by bonding upper MEMS wafer 90 and cap piece wafer 90 cannot be seen in FIG. 6, it will be appreciated that each cavity may be similar to or substantially identical to hermetic cavity 58 of completed microelectronic package 20 shown in FIG. 1.

Upper MEMS wafer 90 may be produced such that MEMS die 26 include sacrificial regions 94, which overly sacrificial regions 82 provided on cap piece wafer 80 and bond pad shelves 38 on lower MEMS wafer 70. At a chosen juncture after bonding upper MEMS wafer 90 to cap piece wafer 80, a Saw-To-Reveal (STR) process is carried-out to remove sacrificial areas 94 from MEMS die 26 (FIG. 6) and sacrificial areas 82 from cap pieces 24 (FIG. 4) by, for example, cutting a number of non-penetrating, parallel trenches through wafer stack 70, 80, 90 utilizing a dicing saw. The trenches do not penetrate lower MEMS wafer 70 and, thus, reveal bond pads shelves 38 and the bond pads 39 supported thereby. This may be more fully appreciated by comparing FIG. 7, which illustrates the region of wafer stack 70, 80, 90 corresponding to microelectronic package 20 prior to STR; to FIG. 8, which illustrates the same region of wafer stack 70, 80, 90 corresponding to package 20 after STR (the surrounding regions of wafer stack 70, 80, 90 not shown). As can be seen, the STR process has resulted in the removal of the sacrificial regions 82 and 94 of cap piece 24 and MEMS die 26, respectively, to expose bond pad row 39 of lower MEMS die 22. As may be further appreciated by comparing FIGS. 7 and 8, MEMS wafers 70 and 90 may initially be bonded in a relatively thick form for added mechanical strength and subsequently thinned to a desired final thickness. Thinning of MEMS wafer 70 may reveal any TSVs buried within each MEMS die 26 (e.g., TSVs 56 shown in FIG. 1) and produced utilizing a via-first approach. Alternatively, a via-last approach may be employed and the desired TSVs (if any) may be formed through each MEMS die 26 after thinning of wafer 70.

With bond pads 39 now revealed, wire bonds (e.g., wire bonds 36 shown in FIG. 1) are formed in contact with pads 39 to interconnect the circuitry of MEMS die 22 with the other microelectronic devices included within the packages produced from wafer stack 70, 80, 90. Wire bonding may be performed prior to or after singulation of wafer stack 70, 80, 90. Singulation of wafer stack 70, 80, 90 separates the wafer stack into a number of discrete die-cap stacks, which may be substantially identical to die-cap stack 22, 24, 26 shown in FIG. 1. Singulation is conveniently carried-out utilizing a dicing saw, which is directed through wafer stack 70, 80, 90 along overlapping saw lanes 74, 84, and 92 (shown in FIGS. 2, 4, and 6, respectively); however, other singulation techniques can be utilized to separate stack 70, 80, 90 into discrete pieces including, for example, laser cutting. Additional microelectronic components to be included in the completed microelectronic packages, such as ASCI die 28 and magnetometer die 30 shown in FIG. 1), may be positioned on and bonded to upper MEMS die 26 prior to or after singulation of wafer stack 70, 80, 90.

Conventional processing steps may be performed to complete fabrication of microelectronic package 50 and the other packages produced from wafer stack 70, 80, 90. Further processing of package 50 may entail encapsulation of die-cap stack 22, 24, 26 and any other components packaged therewith in a molded package body, such as molded package body 32 shown in FIG. 1. For example, a Fan-Out Wafer Level Packaging ("FO-WLP") encapsulation process may be performed during which a pick-and-place tool is used to position partially-completed microelectronic package 50 along with a number of other packages within the central opening of a taped mold frame. An encapsulant, such as a dielectric mold compound, may then be dispensed into the mold frame and over the array of semiconductor die. The encapsulant is thermally cured to produce a molded panel in which the array of semiconductor die is embedded, and the taped mold frame may be removed to reveal the frontside of the molded panel through which the semiconductor die are exposed. A carrier may then be attached to the panel backside to allow an I/O interface (e.g., I/O interface 34 shown in FIG. 1) to be produced over the frontside of the molded panel. Finally, the molded panel may be singulated to yield a number of microelectronic packages each containing a different die-cap stack 22, 24, 26. In further embodiments, a Fan-In Wafer Level Packaging process may be carried-out, in which case die-cap stacks 22, 24, 26 may be incorporated into Chip Scale Packages.

The foregoing has thus described embodiments of a fabrication method for producing a microelectronic package containing at least two axially-partitioned hermetic cavities, which are fluidly isolated and enclose different MEMS transducer structures. The pressure within each hermetic cavity is selected to optimize the performance of the particular MEMS transducer structure enclosed thereby such that the overall performance of the microelectronic packages is enhanced. Notably, the above-described package fabrication process is performed, in whole or at least in substantial part, on a wafer level to allow the simultaneous production of a large number of microelectronic packages in a highly efficient manner. In the above-described example, the hermetic cavities were separated or axially-partitioned by an intervening cap piece; however, in further embodiments, the hermetic cavities may be axially-partitioned by one of the MEMS die. To further illustrate this point, an further exemplary embodiment of a microelectronic package including axially-partitioned hermetic cavities is described below in conjunction with FIGS. 9-13.

Figure 9:
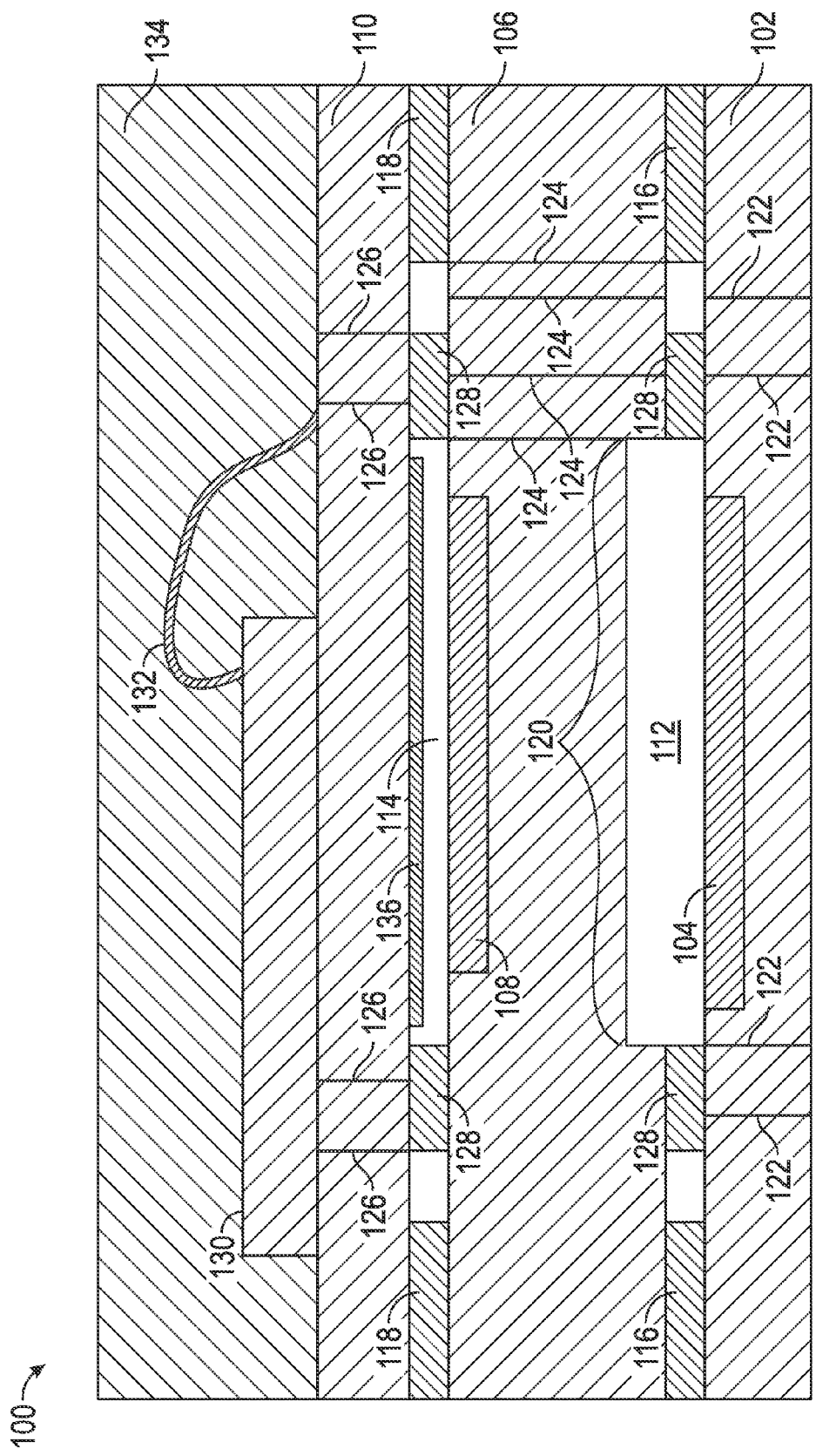
FIG. 9 is a cross-sectional view of a microelectronic package having axially-partitioned hermetic cavities, which enclose different MEMS transducer structures and which contain disparate internal pressures, as illustrated in accordance with a further exemplary embodiment of the present invention.
Figure 10:
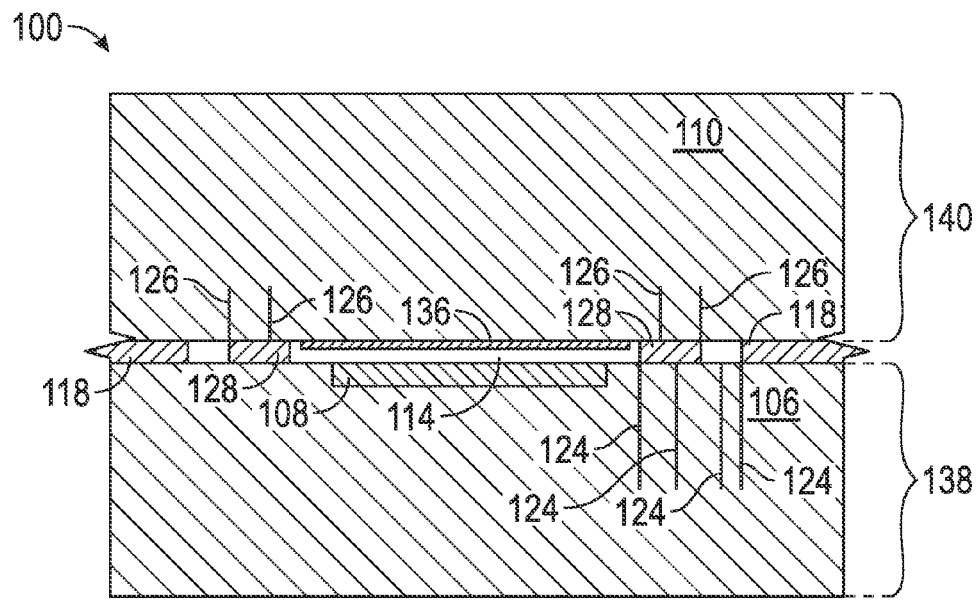
FIGS. 10-13 are cross-sectional views of the microelectronic package shown in FIG. 7, as illustrated at various stages of completion and produced in accordance with a further exemplary embodiment of the package fabrication method.
Figure 11:
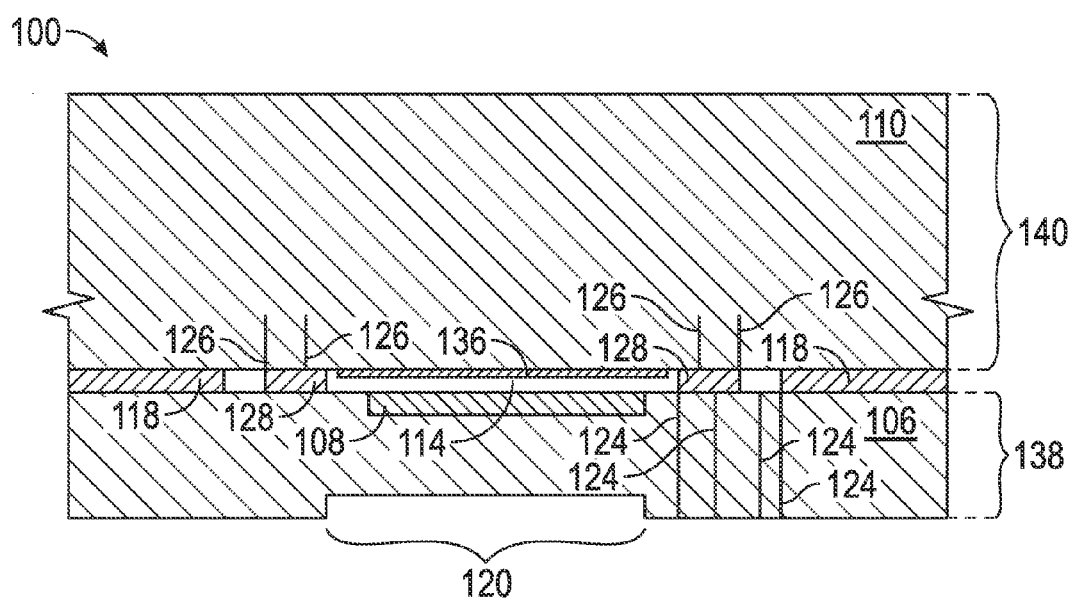

FIG. 9 is a simplified cross-sectional view of a microelectronic package 100, as illustrated in accordance with a further exemplary embodiment. In many respects, microelectronic package 100 is similar to package 20 described above in conjunction with FIGS. 1-8. For example, package 100 includes: (i) a first or lower MEMS die 102 having a first MEMS transducer structure 104 formed thereon, (ii) a second or upper MEMS die 106 having a second MEMS transducer structure 108 formed thereon, and (iii) a cap piece 110 bonded to at least one of MEMS die 102 and 106. As was previously the case, MEMS transducer structures 104 and 108 are enclosed in fluidly-isolated hermetic cavities 112 and 114, respectively, which are bound around their respective perimeters by seal rings 116 and 118 and which contain disparate internal pressures. However, in contrast to microelectronic package 20 described above in conjunction with FIGS. 1-8, upper MEMS die 106 is disposed between lower MEMS die 102 and cap piece 110 such that the active surface or frontside MEMS die 102 is bonded to the backside of MEMS die 106; that is, die 102 and 106 are bonded in a back-to-front configuration. Hermetic cavity 114 is thus defined by cap piece 110, seal ring 118, and the frontside of upper MEMS die 106; while hermetic cavity 112 is defined by the backside of upper MEMS die 106, seal ring 116, and the frontside of lower MEMS die 102. If desired, a recess 120 may be etched or otherwise formed in the backside of upper MEMS die 118 to enlarge the overall volume of hermetic cavity 112. Such a structural configuration may be especially beneficial when a relatively low pressure (e.g., a near vacuum pressure) is sealed within cavity 112, as may be the case when MEMS transducer structure 104 assumes the form of a gyroscope transducer structure.

Although not shown in FIG. 9, an I/O interface may be formed over the backside or lower surface of lower MEMS die 102. Additionally, TSVs 122, 124, and 126 can be formed through lower MEMS die 102, upper MEMS die 106, and cap piece 110, respectively, to provide signal communication between the devices contained within package 100 and the non-illustrated I/O interface. In this case, electrically-conductive bodies may also be deposited at selected locations between lower MEMS die 102, upper MEMS die 106, and cap piece 110 to provide electrical interconnections therebetween. For example, as shown in FIG. 9, electrically-conducive bodies 128 may be deposited between MEMS die 102, upper MEMS die 106, and cap piece 110 to electrically interconnect corresponding pairs of TSVs 122, 124, and 126. In embodiments wherein the bonding material utilized to form seal rings 116 and 118 is electrically conductive, electrically-conductive bodies 128 may be formed in conjunction with seal rings 116 and 118 by plating or otherwise depositing discrete columns, globs, or lines of the electrically-conducive bonding material. If desired, electrical interconnection can also be provided through seal rings 116 and 118. In the illustrated embodiment, a magnetometer die 130 is stacked onto cap piece 110 and interconnected therewith by, for example, wire bonds 132 (one of which is shown). If desired, magnetometer die 130 may be encapsulated in a molded package body 134. In the illustrated embodiment wherein package 100 is encapsulated utilizing a Fan-In Wafer Level Packaging approach, package body 134 does not include a fan-out region surrounding lower MEMS die 102, upper MEMS die 106, and cap piece 110. However, in further embodiments, package 100 may be encapsulated utilizing a FO-WLP package approach, body 134 may include such a fan-out region and surround die 102, die 106, and piece 110.

In certain implementations, an ASIC can be produced on the cap piece to eliminate the need for a separate ASIC die to reduce package height. For example, as shown in FIG. 9, an ASIC 136 may be produced on cap piece 110 and exposed to the pressure within cavity 114. In embodiments wherein ASIC 136 is fluidly coupled to hermetic cavity 114, as is the case in the illustrated example, it may be preferred that the MEMS transducer structure enclosed by cavity 114 (i.e., transducer structure 108) is generally insensitive to pressure fluctuations that can occur due to outgassing of ASIC 136. Thus, in such an implementation, the MEMS transducer structure enclosed by cavity 114 may be an accelerometer transducer structure, while MEMS transducer structure 104 is a gyroscope transducer structure. In further embodiments, MEMS transducer structures 104 and 108 may assume other forms.

Figure 12:
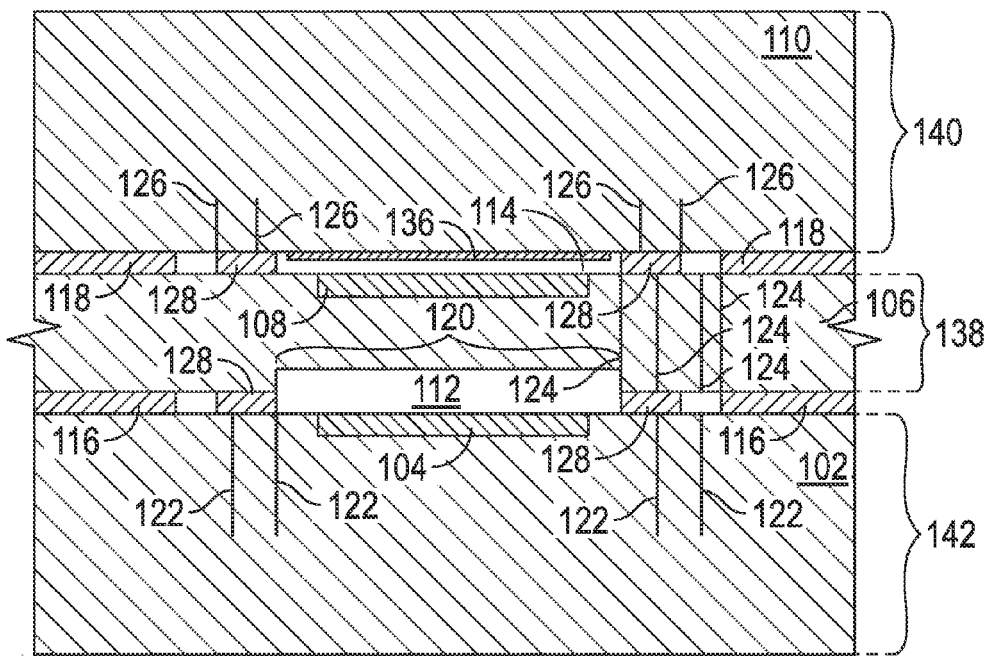
Figure 13:
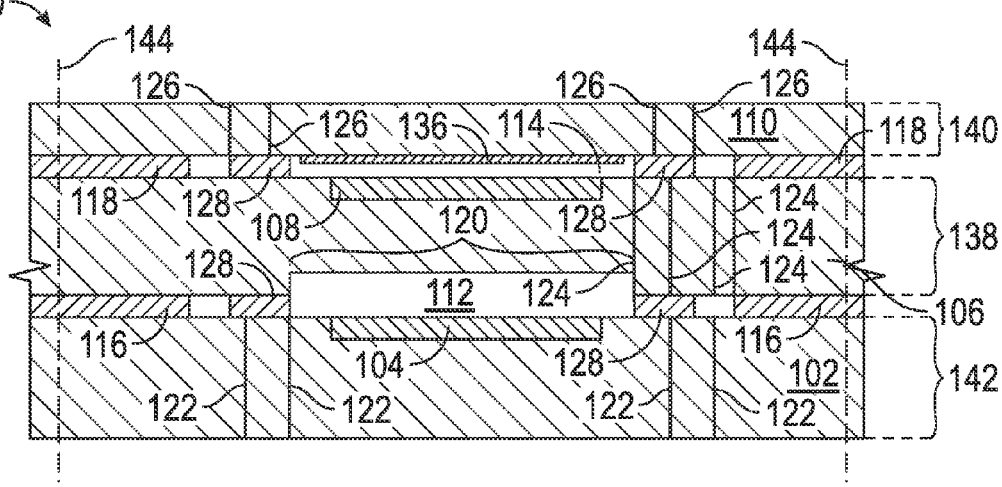

Microelectronic package 100 is advantageously produced utilizing a wafer level fabrication process, such as that illustrated in FIGS. 10-13. During the fabrication process, a first or upper MEMS wafer 138 (partially shown in FIG. 10) containing die 106 may be bonded to a cap piece wafer 140 (also partially shown) containing cap piece 110. As was previously the case, bonding is carried-out under process conditions sufficient to entrap the desired pressure within cavities 114. After bonding MEMS wafer 138 and cap piece wafer 140, wafers 138 and 140 may be back-ground or otherwise thinned to a desired thickness (shown in FIG. 11). Back grinding also may reveal TSVs 124 and 126 through the respective backsides of wafers 138 and 140. If desired, bulk etching of the backside of MEMS wafer 138 may be performed after back-grinding to produce recesses 120. Next, as shown in FIG. 12, a second or lower MEMS wafer 142 (partially shown in FIG. 12) containing MEMS die 102 may be bonded to upper MEMS wafer 138 to produce cavities 112 enclosing MEMS transducer structures 104. Again, bonding is carried-out under process conditions sufficient to seal a predetermined pressure within cavities 112 optimizing performance of structures 104. MEMS wafer 138 may also be thinned to bring wafer 138 to its final thickness and to reveal any TSVs 122 formed therein. The resultant structure is shown in FIG. 13. After thinning of MEMS wafer 138, additional devices (e.g., magnetometer die 130 shown in FIG. 9) may be attached and interconnected with the wafer stack, which may then be singulated (indicated in FIG. 13 by lines 144). Additional processing steps (e.g., encapsulation and formation of an I/O interface) may then be performed to complete fabrication of package 100 (FIG. 9) and the other packages produced in parallel therewith.

There have thus been provided multiple exemplary embodiments of a microelectronic package and methods for producing microelectronic packages including at least two fluidly-isolated hermetic cavities, which enclose MEMS transducer structures and which contain different pressures. As the hermetic cavities are fluidly-isolated, the pressure within each cavity can be tailored to optimize the performance of the particular MEMS transducer structure enclosed thereby. In certain embodiments, the MEMS transducer structures are formed on separate sensor die, which are stacked and bonded along with a cap piece. The hermetically-sealed cavities are separated by an intervening structure or body (as taken along the centerline of the package), which may be one of the sensor die or the cap piece wafer. Due to the stacked or three dimensional design of the packaged described herein, embodiments of the microelectronic packages have reduced planform dimensions as compared to known packages containing MEMS transducer structures disposed in a side-by-side relationship. If desired, ASIC or other circuitry may be produced on the cap piece to eliminate the need for a discrete ASICs die in certain implementations. As a still further advantage, the above-described fabricating process can be performed, in whole or in substantial part, on a wafer level to allow the simultaneous production of a large number of microelectronic packages thereby improving manufacturing efficiency.

In one embodiment, the above-described package fabrication method includes the steps/process of bonding a first MEMS die having a first MEMS transducer structure thereon to a cap piece. The first MEMS die and cap piece are bonded such that a first hermetically-sealed cavity is formed enclosing the first MEMS transducer. A second MEMS die having a second MEMS transducer structure thereon is further bonded to one of the cap piece and the second MEMS die. The second MEMS die and the cap piece are bonded such that a second hermetically-sealed cavity is formed enclosing the second MEMS transducer. The second hermetically-sealed cavity contains a different internal pressure than does the first hermetically-sealed cavity.

In a further embodiment, the above-described package fabrication method includes the steps/processes of bonding a first wafer to a second wafer to produce a two wafer stack comprising a first array of MEMS transducer structures enclosed by a first plurality of hermetic cavities each containing a first predetermined pressure. A third wafer is bonded to the two wafer stack to produce a three wafer stack comprising a second array of MEMS transducer structures enclosed by a second plurality of hermetic cavities each containing a second predetermined pressure different than the first predetermined pressure. The three wafer stack is then singulated into a plurality of die-cap stacks each including axially-partitioned hermetic cavities enclosing different MEMS transducer structures and containing different internal pressures.

Embodiments of a microelectronic package have also been provided. In one embodiment, the microelectronic package includes a first MEMS die having a first MEMS transducer structure formed thereon, a second MEMS die having a second MEMS transducer structure formed thereon, and a cap piece stacked with the first and second MEMS die. A first hermetically-sealed cavity encloses the first MEMS transducer structure and contains a first predetermined pressure. Similarly, a second hermetically-sealed cavity encloses the second MEMS transducer structure and contains a second predetermined pressure different than the first predetermined pressure.

While at least one exemplary embodiment has been presented in the foregoing Detailed Description, it should be appreciated that a vast number of variations exist. It should also be appreciated that the exemplary embodiment or exemplary embodiments are only examples, and are not intended to limit the scope, applicability, or configuration of the invention in any way. Rather, the foregoing Detailed Description will provide those skilled in the art with a convenient road map for implementing an exemplary embodiment of the invention. It being understood that various changes may be made in the function and arrangement of elements described in an exemplary embodiment without departing from the scope of the invention as set-forth in the appended claims.

What is claimed is:

1. A method for fabricating a microelectronic package, comprising:
    bonding a first Microelectromechanical Systems (MEMS) die having a first MEMS transducer structure thereon to a cap piece such that a first hermetically-sealed cavity is formed enclosing the first MEMS transducer;
    bonding a second MEMS die having a second MEMS transducer structure thereon to one of the cap piece and the second MEMS die such that a second hermetically-sealed cavity is formed enclosing the second MEMS transducer, the second hermetically-sealed cavity containing a different internal pressure than does the first hermetically-sealed cavity;
    removing a portion of the second MEMS die and the cap piece overlying a bond pad shelf on the first MEMS die to reveal the bond pad shelf and a plurality of bonds pads thereon; and
    forming wire bonds in contact with the plurality of bonds to electrically interconnect the first MEMS die with the second MEMS die.

2. The method of claim 1 wherein the first MEMS die, the second MEMS die, and the cap piece are bonded in wafer form to produce a wafer stack; and
    wherein the method further comprises singulating the wafer stack to produce the microelectronic packages along with a plurality of other microelectronic packages.

3. The method of claim 1 wherein the first MEMS transducer structure comprises a gyroscope transducer structure, wherein the second MEMS transducer structure comprises an accelerometer transducer structure, and wherein the first hermetically-sealed cavity contains an internal pressure less than the second MEMS transducer structure.

4. The method of claim 1 wherein the first cap piece is bonded to the second MEMS die such that an Application Specific Integrated Circuit formed on the cap piece is exposed to the pressure within the second hermetically-sealed cavity.

5. The method of claim 4 wherein the second MEMS transducer structure comprises a gyroscope transducer structure, and wherein the pressure within the second hermetically-sealed cavity is less than the pressure within the first hermetically-sealed cavity.

6. The method of claim 1 wherein the first MEMS die is bonded to the cap piece utilizing a first bonding material, and wherein the second MEMS die is bonded to one of the cap piece and the second MEMS die utilizing a second bonding material different than the first bonding material.

7. The method of claim 6 wherein the first bonding material has a greater bonding temperature than does the second bonding material.

8. The method of claim 1 wherein the second MEMS die is bonded to the cap piece opposite the first MEMS die such that the first and second MEMS die are stacked in a face-to-face relationship.

9. The method of claim 1 wherein the second MEMS die is bonded to the first MEMS die such that the first and second MEMS die are stacked in a face-to-back relationship.

10. The method of claim 9 further comprising etching a recess into the backside of the second MEMS die prior to bonding to the first MEMS die, the recess enlarging the volume of the first hermetically-sealed cavity.

11. The method of claim 1 further comprising forming electrical connections to through silicon vias formed through at least one of the first and second MEMS die to interconnect the first and second MEMS die with an input/out interface accessible from the exterior of the microelectronic package.

12. A method for fabricating microelectronic packages, comprising:
bonding a first wafer to a second wafer to produce a two wafer stack comprising a first array of Microelectromechanical Systems (MEMS) transducer structures enclosed by a first plurality of hermetic cavities each containing a first predetermined pressure;
bonding a third wafer to the two wafer stack to produce a three wafer stack comprising a second array of MEMS transducer structures enclosed by a second plurality of hermetic cavities each containing a second predetermined pressure different than the first predetermined pressure; and
singulating the three wafer stack into a plurality of die-cap stacks each including axially-partitioned hermetic cavities enclosing different MEMS transducer structures and containing different internal pressures.

13. The method of claim 12 wherein the first array of MEMS transducer structures are formed on the first wafer, wherein the second array of MEMS transducer structures are formed on the third wafer, and wherein third wafer is bonded to the second wafer opposite the first wafer to produce the three wafer stack.

14. The method of claim 12 wherein the first array of MEMS transducer structures are formed on the first wafer, wherein the second array of MEMS transducer structures are formed on the third wafer, and wherein third wafer is bonded to the first wafer opposite the second wafer to produce the three wafer stack.

15. The method of claim 12 wherein the first wafer is bonded to the second wafer utilizing a first electrically-conductive bonding material, and wherein the second wafer is bonded to the two wafer stack utilizing a second electrically-conductive bonding material having a lower bonding temperature than does the first electrically-conductive bonding material.

16. The method of claim 12 wherein the first array of MEMS structures is formed on the first wafer, and wherein the second array of MEMS structures is formed on one of the second and third wafers.

17. The method of claim 12 wherein, for each of the plurality of die-cap stacks defined by singulation of the three wafer stack, the axially-partitioned hermetic cavities overlap vertically as taken along a centerline of the die-cap stack.

18. The method of claim 13 wherein, for each of the plurality of die-cap stacks defined by singulation of the three wafer stack, the axially-partitioned hermetic cavities are partitioned by a singulated piece of one of the second and third wafers.

19. A method for fabricating a microelectronic package, comprising:
bonding a first Microelectromechanical Systems (MEMS) die having a first MEMS transducer structure thereon to a cap piece such that a first hermetically-sealed cavity is formed enclosing the first MEMS transducer;
bonding a second MEMS die having a second MEMS transducer structure thereon to the first MEMS die such that the first and second MEMS die are stacked in a face-to-back relationship and such that a second hermetically-sealed cavity is formed enclosing the second MEMS transducer, the second hermetically-sealed cavity containing a different internal pressure than does the first hermetically-sealed cavity; and
etching a recess into the backside of the second MEMS die prior to bonding to the first MEMS die, the recess enlarging the volume of the first hermetically-sealed cavity.

20. The method of claim 19 wherein the first MEMS die, the second MEMS die, and the cap piece are bonded in wafer form to produce a wafer stack; and
wherein the method further comprises singulating the wafer stack to produce the microelectronic packages along with a plurality of other microelectronic packages.

* * * * *